United States Patent
Vice et al.

(10) Patent No.: US 7,274,268 B2
(45) Date of Patent: Sep. 25, 2007

(54) BALUN WITH STRUCTURAL ENHANCEMENTS

(75) Inventors: Michael W. Vice, El Granada, CA (US); Tiberiu Jamneala, San Francisco, CA (US); Michael L. Frank, Los Gatos, CA (US)

(73) Assignee: Avago Technologies Wireless IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 10/974,192

(22) Filed: Oct. 27, 2004

(65) Prior Publication Data

US 2006/0087383 A1 Apr. 27, 2006

(51) Int. Cl.
*H03H 7/42* (2006.01)
(52) U.S. Cl. .......................... 333/26; 333/25
(58) Field of Classification Search ............. 333/26, 333/116, 238; 438/599
See application file for complete search history.

(56) References Cited

U.S. PATENT DOCUMENTS

| | | | |
|---|---|---|---|
| 5,313,175 A * | 5/1994 | Bahl et al. ............... | 333/116 |
| 5,745,017 A * | 4/1998 | Ralph ....................... | 333/116 |
| 6,873,221 B2 * | 3/2005 | Lucero et al. ............ | 333/26 |
| 6,939,788 B2 * | 9/2005 | Davies ...................... | 438/599 |
| 7,027,795 B2 * | 4/2006 | Ji ............................. | 455/333 |

OTHER PUBLICATIONS

John R. Long, Monolithic Transformers for Silicon RF IC Design, Sep. 2000, IEEE, 14 pages.*

* cited by examiner

*Primary Examiner*—Dean Takaoka

(57) ABSTRACT

A balun including a pair of metal coil structures and an intervening dielectric layer having a thickness that is selected in response an operating frequency of the balun. The thickness of the dielectric layer may be used to tune the balun and enhance its self-inductance at its operating frequency. In addition, a balun with a pair of metal coil structures formed with an asymmetry that is selected to minimize an amplitude error in its output signal. A balun according the present teachings may also include an asymmetry in the positioning of its output terminals. The positioning of the output terminals of a balun may be adjusted to minimize phase errors at its output signal.

26 Claims, 2 Drawing Sheets

BALUN WITH STRUCTURAL ENHANCEMENTS

BACKGROUND

A balun may be employed in a variety of electronic circuits to transform a single-ended input signal into a balanced output signal. A single-ended input signal may be defined as an electrical signal that is carried on two signal lines with one of the signal lines tied to ground. A balanced output signal may be defined as an electrical signal that is carried on three signal lines with one of the signal lines tied to ground and the remaining two signal lines carrying electrical signals of equal amplitude but opposite phase.

A balun may be implemented by forming a pair of metal coil structures in relatively close proximity to one another. For example, a balun may include a primary metal coil structure formed adjacent to a secondary coil structure with an intervening dielectric that separates the primary and secondary metal coil structures. A single-ended input signal applied to the primary metal coil structure may be used to induce an image electrical signal in the secondary metal coil structure and provide a balance output signal from the secondary metal coil structure.

It may be desirable to form a balun so that the self-inductance of its metal coil structures is maximized. For example, a balun having metal coil structures with a relatively low amount of self-inductance may place an undesirable load on an electronic circuit. In addition, metal coil structures formed on an integrated circuit die may suffer from a relatively low amount of self-inductance as a consequence of the relatively limited space in which to form a balun.

In addition, the metal coil structures in prior baluns may cause amplitude and phase errors in its output signal. For example, the asymmetry in the input signal to a balun, i.e. one input terminal connected to ground and the other to an input signal, may cause undesirable differences in the amplitudes and phases of in the output signals on its two output terminals.

SUMMARY OF THE INVENTION

A balun is disclosed that includes a pair of metal coil structures and an intervening dielectric layer having a thickness that is selected in response an operating frequency of the balun. The thickness of the dielectric layer may be used to tune the balun and enhance its self-inductance at its operating frequency.

In addition, a balun is disclosed with a pair of metal coil structures formed with an asymmetry that is selected to minimize an amplitude error in its output signal. A balun according the present teachings may also include an asymmetry in the positioning of its output terminals. The positioning of the output terminals of a balun may be adjusted to minimize phase errors at its output signal.

Other features and advantages of the present invention will be apparent from the detailed description that follows.

BRIEF DESCRIPTION OF THE DRAWINGS

The present invention is described with respect to particular exemplary embodiments thereof and reference is accordingly made to the drawings in which.

DETAILED DESCRIPTION

Figure 1:
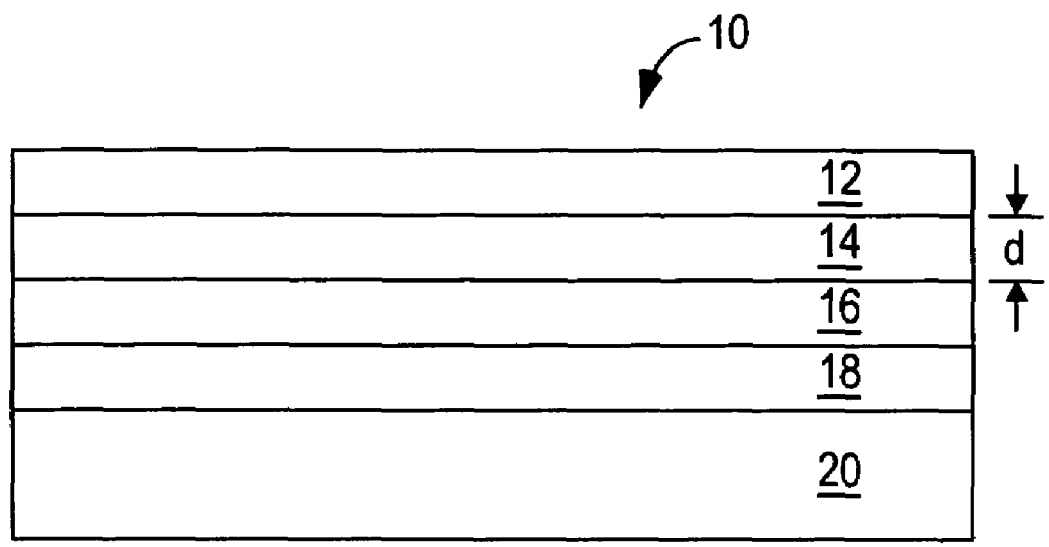
FIG. 1 is a cross-sectional view of a balun according to the present teachings.

FIG. 1 is a cross-sectional view of a balun 10 according to the present teachings. The balun 10 includes pair of metal coil structures 12 and 16 that are separated by a dielectric layer 14. The metal coil structures 12 and 16 and the intervening dielectric layer 14 are in one embodiment formed on a dielectric layer 18 over a substrate 20, e.g. an integrated circuit die.

The physical arrangement of the coil structures 12 and 16 and the intervening dielectric layer 14 causes a parasitic capacitance of Cx in the balun 10. The value of Cx is a function of the physical characteristics of the metal coil structures 12 and 16 and a thickness d of the dielectric layer 14. The present techniques include adjusting the thickness d of the dielectric layer 14 to tune the balun 10 to an operating frequency of interest for the balun 10.

Figure 2:
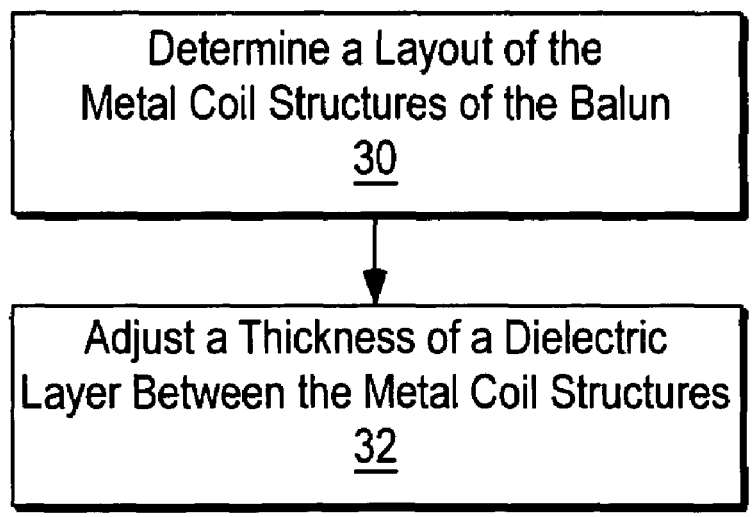
FIG. 2 shows a method for designing a balun according to the present techniques.

FIG. 2 shows a method for designing the balun 10 according to the present techniques. At step 30, a physical layout for the metal coil structures 12 and 16 is determined. Determining the physical layout of the metal coil structures 12 and 16 may include determining the number of turns in each metal coil structure 12 and 16 and determining the size of the turns.

Step 30 may be performed in response to a variety of application-specific criteria for the balun 10 using known design techniques. The application-specific criteria for the balun 10 may include its overall physical dimensions and its lowest operating frequency of interest. For example, if the balun 10 is to be contained on an integrated circuit die then its overall physical dimensions may restrict the number and size of the turns in the metal coil structures 12 and 16.

At step 32, the thickness d of the dielectric layer 14 is adjusted to tune the balun 10. The thickness d of the dielectric layer 14 may adjusted to adjust the value of the parasitic capacitance Cx in the balun 10 to a desired value. For example, the thickness d of the dielectric layer 14 may be increased to decrease the value of the parasitic capacitance Cx in the balun 10. Conversely, the thickness d of the dielectric layer 14 may be decreased to increase the value of the parasitic capacitance Cx in the balun 10.

The value of the parasitic capacitance Cx may be used to tune a resonant frequency of the balun 10 to a lowest frequency of interest for the balun 10. The tuning of the resonant frequency of the balun 10 to a lowest frequency of interest may be used to minimize the loss of the balun 10 at the frequency of interest. Known simulation techniques may be used to determine the resonant frequency of the balun 10 in response to different values of the parasitic capacitance Cx yielded by changes to the thickness d of the dielectric layer 14.

Figure 3:
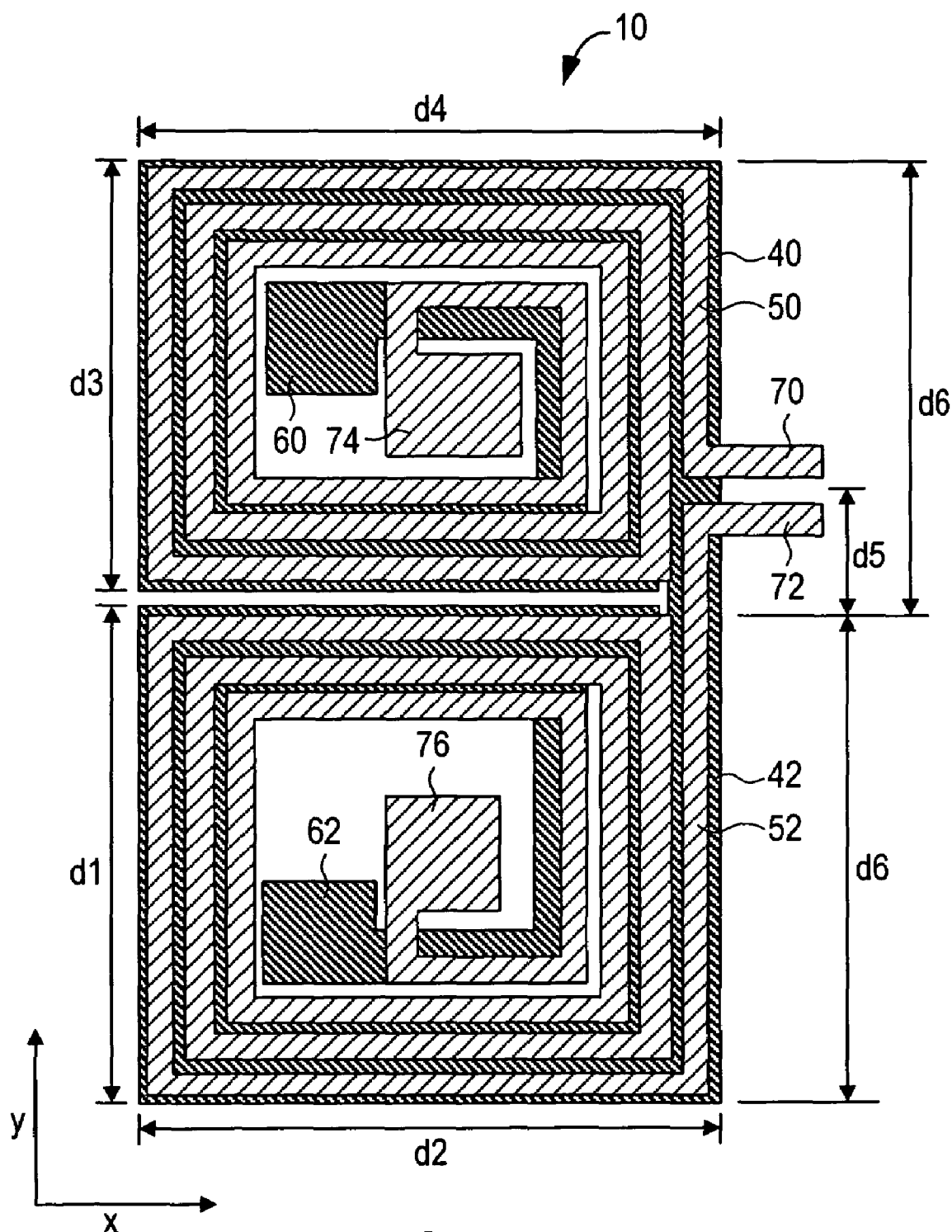
FIG. 3 shows a top view of a physical layout for a balun that is selected to minimize amplitude and phase errors in its output signal.

FIG. 3 shows a top view of a physical layout for the balun 10 that is selected to minimize amplitude and phase errors in its output signal. The metal coil structure 12 is shown over the metal coil structure 16. The metal coil structure 12 includes a half-structure 40 and a half-structure 42. Similarly, the metal coil structure 16 includes a half-structure 50 and a half-structure 52.

The half-structures 50 and 52 include a pair of pads 60 and 62, respectively, that provide an input port for the balun 10. The pad 62 may be connected to a ground plane of an integrated circuit that holds the balun 10 and the pad 60 may be connected to a bond wire that carries an input signal to the balun 10.

The half-structures 40 and 42 include a pair of pads 74 and 76, respectively, and a pair of output lines 70 and 72, respectively, that provide an output port for the balun 10. The pads 74 and 76 may be connected to a ground plane on an integrated circuit that holds the balun 10 and the lines 70 and 72 may be connected to an external circuit that receives a balanced output signal from the balun 10.

The balun 10 is formed with an asymmetry in the half-structures 40 and 42 and 50 and 52 so as to correct for amplitude errors in its output signal. The half-structures 40 and 50 are larger than the half-structures 42 and 52 by an amount that is selected to minimize amplitude errors in the output signal at the output lines 70 and 72. The half-structures 40 and 50 have an x dimension of d4 and a y-dimension of d3 and the half-structures 42 and 52 have an x dimension of d2 and a y-dimension of d1. In one embodiment, d2=d4 and d1>d3 and the amount by which d1 is greater than d3 is selected to minimize amplitude errors in the output signal at the output lines 70 and 72. The value of d1–d3 may be determined by experimentation or by simulation of the balun 10 in a system under design.

The balun 10 is formed with an asymmetry in the positions of the output lines 70 and 72 in the y-direction so as to correct for phase errors in its output signal. In one embodiment, the output lines 70 and 72 are offset in the positive y-direction by a distance d5 from a midpoint located a distance d6 from each extreme y edge of the balun 10. The position of the output lines 70 and 72 contrasts with prior art baluns that typically position output lines equidistant from the edges. The distance d5 is selected to minimize phase errors in an output signal at the of a balun lines 70-72. The value of d5 may be determined by experimentation or by simulation of the balun 10 in a system under design.

In one embodiment, the substrate 20 is an integrated circuit substrate, e.g. gallium arsenide, and the metal coil structures 12 and 16 are formed using photolithography. The balun 10 has an operating frequency of 2110-2170 MHz. The metal coil structures 12 and 16 are formed of gold and the dielectric layer 14 is BCB. The dimensions d6=350 microns and d2=600 microns. A resonant frequency of 2000 MHz for the balun 10 in this embodiment is achieved with the thickness d=1 micron for the dielectric layer 14.

A 2.5 dimension field solver may be used to determine the electrical characteristics of the metal coil structures 12 and 16 as well as the electrical performance of the balun 10 in response to changes in the structures of the balun 10 as described above. For example, a trial and error method may be employed to adjust the thickness d of the dielectric layer 14 while the 2.5 dimension field solver is used to evaluate the electrical characteristics of the balun 10 for each trial thickness d until a suitable value for d is found. Similarly, a trial and error method may be employed to adjust the asymmetry of the metal coil structures 12 and 16 and/or the asymmetry in positioning the output lines 70 and 72 while the 2.5 dimension field solver is used to evaluate the electrical characteristics of each trial until a suitable design is found.

The foregoing detailed description of the present invention is provided for the purposes of illustration and is not intended to be exhaustive or to limit the invention to the precise embodiment disclosed. Accordingly, the scope of the present invention is defined by the appended claims.

What is claimed is:

1. A method of designing a balun, comprising adjusting a thickness of a first dielectric layer separating a second layer of a first metal coil structure from a third layer of a second metal coil structure of the balun to tune the balun to a selected operating frequency.

2. The method of claim 1, wherein adjusting the thickness of the first dielectric layer comprises adjusting the thickness of the first dielectric layer to yield a desired parasitic capacitance of the balun.

3. The method of claim 2, wherein adjusting the thickness of the first layer further comprises determining the desired parasitic capacitance in to yield a desired resonant frequency of the balun.

4. The method of claim 1, wherein adjusting the thickness of the first dielectric layer further comprises adjusting the thickness in accordance with a selected physical layout of the metal coil structures.

5. The method of claim 1, further comprising determining an asymmetry in the metal coil structures such that the asymmetry yields a minimized amplitude error in an output signal of the balun.

6. The method of claim 1 further comprising determining a position of a set of output lines of the balun such that the position yields a minimized phase error in an output signal of the balun.

7. A balun, comprising:
a pair of metal coil structures formed in respective second and third layers;
a first dielectric layer separating the second and third layers and having a thickness selected in accordance with a selected operating frequency of the balun.

8. The balun of claim 7, wherein the thickness is selected to yield a desired parasitic capacitance of the balun.

9. The balun of claim 7, wherein the thickness is selected to yield a selected resonant frequency of the balun.

10. The balun of claim 7, wherein the thickness is selected in accordance with a selected physical layout of the metal coil structures.

11. The balun of claim 7, wherein the metal coil structures are configured asymmetrically to minimize an amplitude error in an output signal of the balun.

12. The balun of claim 7, wherein a position of a set of output lines of the balun is selected to minimize a phase error in an output signal of the balun.

13. A balun having a pair of asymmetrically configured metal coil structures configured to minimize an amplitude error in an output signal of the balun.

14. The balun of claim 13, wherein the asymmetrically configured metal coil structures further comprise a first half-structure of the metal coil structures that is larger than a second half-structure of the metal coil structures.

15. The balun of claim 13, further comprising a pair of output lines positioned to minimize a phase error in the output signal of the balun.

16. The balun of claim 13, further comprising a dielectric layer disposed between the metal coil structures, the dielectric layer having a thickness selected to tune the balun to a selected operating frequency.

17. The balun of claim 16, wherein the thickness of the dielectric layer is selected to yield a desired parasitic capacitance of the balun.

18. The balun of claim 16, wherein the thickness of the dielectric layer is selected to yield a desired resonant frequency of the balun.

19. The balun of claim 16, wherein the thickness of the dielectric layer is selected in accordance with a selected physical layout of the metal coil structures.

20. A method for designing a balun, comprising determining an asymmetric configuration for a pair of metal coil structures in the balun that yields a minimized amplitude error in an output signal of the balun.

21. The method of claim 20, further comprising providing providing a first half-structure of the metal coil structures is larger than a second half-structure of the metal coil structures.

22. The method of claim 20, further comprising determining a position for a set of output lines of the balun to minimize a phase error in the output signal of the balun.

23. The method of claim 20, further comprising adjusting a thickness of a dielectric layer disposed between the metal coil structures to tune the balun to a selected operating frequency.

24. The method of claim 23, wherein adjusting the thickness comprises adjusting the thickness to yield a desired parasitic capacitance of the balun.

25. The method of claim 23, wherein adjusting the thickness comprises adjusting the thickness to yield a desired resonant frequency for the balun.

26. The method of claim 23, wherein adjusting the thickness comprises adjusting the thickness in accordance with a selected physical layout of the metal coil structures.

* * * * *

UNITED STATES PATENT AND TRADEMARK OFFICE
CERTIFICATE OF CORRECTION

PATENT NO. : 7,274,268 B2
APPLICATION NO. : 10/974192
DATED : September 25, 2007
INVENTOR(S) : Michael Vice It is certified that error appears in the above-identified patent and that said Letters Patent is hereby corrected as shown below:

Col. 2 Line 13 Delete "the" and insert -- to the --, therefor.

Col. 4 Line 25 In Claim 6, after "claim 1" insert -- , --.

Col. 5 Line 9 In Claim 21, before "a first" delete "providing".

Signed and Sealed this

Seventeenth Day of March, 2009

JOHN DOLL
*Acting Director of the United States Patent and Trademark Office*